United States Patent
Jose et al.

(10) Patent No.: US 11,659,695 B2
(45) Date of Patent: May 23, 2023

(54) TELEMETRY SYSTEM SUPPORTING IDENTIFICATION OF DATA CENTER ZONES

(71) Applicant: Dell Products, L.P., Round Rock, TX (US)

(72) Inventors: Cyril Jose, Austin, TX (US); Sankunny Jayaprasad, Round Rock, TX (US); Jon Robert Hass, Austin, TX (US); Sankara Rao Gara, Cedar Park, TX (US); Sailaja Mahendrakar, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 137 days.

(21) Appl. No.: 16/930,987

(22) Filed: Jul. 16, 2020

(65) Prior Publication Data

US 2022/0022344 A1 Jan. 20, 2022

(51) Int. Cl.
*H05K 7/20* (2006.01)
*G06F 1/20* (2006.01)
*G06F 11/34* (2006.01)

(52) U.S. Cl.
CPC ........... *H05K 7/20836* (2013.01); *G06F 1/20* (2013.01); *G06F 11/3452* (2013.01); *H05K 7/20745* (2013.01)

(58) Field of Classification Search
CPC .. H05K 7/20836; H05K 7/20745; G06F 1/20; G06F 11/3452
See application file for complete search history.

(56) References Cited

U.S. PATENT DOCUMENTS

| | | | |
|---|---|---|---|
| 6,882,307 B1* | 4/2005 | Gifford | G06Q 10/087 701/469 |
| 2009/0072967 A1* | 3/2009 | Campbell | G01S 13/876 340/539.13 |
| 2010/0179695 A1* | 7/2010 | Collins | H05K 7/1497 700/276 |
| 2014/0280804 A1* | 9/2014 | Thodati | H04L 41/0806 709/222 |
| 2017/0257303 A1* | 9/2017 | Boyapalle | H04L 67/1001 |
| 2017/0357299 A1* | 12/2017 | Shabbir | H05K 7/20836 |
| 2020/0034269 A1* | 1/2020 | Ganesan | G06F 17/18 |
| 2020/0145308 A1* | 5/2020 | Al Ramady | H04L 41/0618 |

* cited by examiner

*Primary Examiner* — Oleg Survillo
*Assistant Examiner* — Monishwar Mohan
(74) *Attorney, Agent, or Firm* — Fogarty LLP (57) ABSTRACT

Telemetry system metric data that is collected within a data center may be collectively analyzed in order to identify zones within the data center that exhibit deviations in reported metric data. The analyzed metric data is collected from IHSs (Information Handling Systems), such as servers, operating in the data center. The metric data reported by the respective IHSs identifies the location the IHS within the data center. The collected metric data is analyzed to identify metrics that are correlated with locations within the data center. Within the identified metric data that is correlated with data center locations, a zone of the data center is identified that includes a subset of IHSs that have reported anomalous metric data relative to the metric data reported by neighboring IHSs. For instance, such a zone may be an aisle of the data center, one or more racks, and/or rows of servers spanning multiple racks.

20 Claims, 5 Drawing Sheets

|  | Rack 1 | Rack 2 | Rack 3 | Rack 4 | Rack 5 | Rack 6 | Rack 7 |
|---|---|---|---|---|---|---|---|
| Row 1 | 24°C | 27°C | 32°C | 25°C | 32°C | 26°C | 31°C |
| Row 2 | 37°C | 32°C | 43°C | 41°C | 29°C | 32°C | 37°C |
| Row 3 | 48°C | 46°C | 50°C | 45°C | 50°C | 37°C | 37°C |
| Row 4 | 47°C | 50°C | 47°C | 46°C | 40°C | 53°C | 46°C |
| Row 5 | 29°C | 33°C | 32°C | 24°C | 34°C | 34°C | 29°C |
| Row 6 | 28°C | 20°C | 23°C | 26°C | 16°C | 28°C | 27°C |
| Row 7 | 26°C | 26°C | 26°C | 26°C | 23°C | 23°C | 25°C |

FIG. 4B

|  | Rack 1 | Rack 2 | Rack 3 | Rack 4 | Rack 5 | Rack 6 | Rack 7 |
|---|---|---|---|---|---|---|---|
| Row 1 | 24°C | 27°C | 32°C | 25°C | 32°C | 26°C | 31°C |
| Row 2 | 37°C | 32°C | 43°C | 41°C | 29°C | 32°C | 29°C |
| Row 3 | 29°C | 32°C | 50°C | 45°C | 37°C | 37°C | 37°C |
| Row 4 | 32°C | 37°C | 47°C | 46°C | 32°C | 29°C | 32°C |
| Row 5 | 29°C | 33°C | 53°C | 50°C | 34°C | 34°C | 29°C |
| Row 6 | 28°C | 20°C | 50°C | 48°C | 16°C | 28°C | 27°C |
| Row 7 | 26°C | 26°C | 48°C | 46°C | 23°C | 23°C | 25°C |

|       | Rack 1 | Rack 2 | Rack 3 | Rack 4 | Rack 5 | Rack 6 | Rack 7 |
|-------|--------|--------|--------|--------|--------|--------|--------|
| Row 1 | 5.3 W  | 3.3 W  | 4.8 W  | 5.1 W  | 4.3 W  | 3.6 W  | 0.3 W  |
| Row 2 | 5.0 W  | 5.3 W  | 5.2 W  | 3.8 W  | 3.3 W  | 5.0 W  | 0.8 W  |
| Row 3 | 4.3 W  | 2.3 W  | 3.6 W  | 2.8 W  | 5.3 W  | 4.2 W  | 1.1 W  |
| Row 4 | 5.3 W  | 2.5 W  | 4.4 W  | 3.3 W  | 3.0 W  | 5.1 W  | 0.5 W  |
| Row 5 | 3.6 W  | 1.7 W  | 5.4 W  | 4.5 W  | 2.8 W  | 2.3 W  | 0.8 W  |
| Row 6 | 3.8 W  | 2.9 W  | 3.8 W  | 3.9 W  | 3.8 W  | 2.6 W  | 0.7 W  |
| Row 7 | 5.3 W  | 4.5 W  | 5.0 W  | 6.3 W  | 3.3 W  | 5.3 W  | 0.6 W  |

FIG. 5A

|       | Rack 1 | Rack 2 | Rack 3 | Rack 4 | Rack 5 | Rack 6 | Rack 7 |
|-------|--------|--------|--------|--------|--------|--------|--------|
| Row 1 | 28780 Bytes | 36250 Bytes | 81220 Bytes | 33600 Bytes | 54250 Bytes | 22600 Bytes | 1650 Bytes |
| Row 2 | 45680 Bytes | 36560 Bytes | 46570 Bytes | 58650 Bytes | 65850 Bytes | 39560 Bytes | 1850 Bytes |
| Row 3 | 77450 Bytes | 48950 Bytes | 55450 Bytes | 42530 Bytes | 75940 Bytes | 66550 Bytes | 1250 Bytes |
| Row 4 | 66450 Bytes | 48360 Bytes | 74250 Bytes | 65240 Bytes | 29840 Bytes | 33620 Bytes | 1820 Bytes |
| Row 5 | 58640 Bytes | 74500 Bytes | 49520 Bytes | 85450 Bytes | 65230 Bytes | 58750 Bytes | 1400 Bytes |
| Row 6 | 52310 Bytes | 71250 Bytes | 84310 Bytes | 46370 Bytes | 76540 Bytes | 39540 Bytes | 960 Bytes |
| Row 7 | 78360 Bytes | 58250 Bytes | 84230 Bytes | 74120 Bytes | 69450 Bytes | 37560 Bytes | 1880 Bytes |

FIG. 5B

TELEMETRY SYSTEM SUPPORTING IDENTIFICATION OF DATA CENTER ZONES

FIELD

The present disclosure generally relates to Information Handling Systems (IHSs), and, more particularly, to telemetry systems used by IHSs.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use, such as financial transaction processing, airline reservations, enterprise data storage, or global communications. In addition, IHSs may include a variety of hardware and software components that may be configured to process, store, and communicate information and may include one or more computer systems, data storage systems, and networking systems.

The operation of an IHS may be characterized by metrics that provide a measurable aspect of the IHS's operation. For instance, an IHS metric may provide environmental sensor readings, such a temperature sensor measurement, or an operational sensor reading, such as the amps being drawn by a component of the IHS. An IHS metric may also provide discrete information, such as the operational state of a component. An IHS metric may also provide a logical rather than physical sensor measurement, such as a digital counter measuring the amount of data transferred by a networking component of the IHS. An IHS may utilize a telemetry system in order to configure and manage the collection of metric reports from various sources of metric data within the IHS. Using the metric data collected by a telemetry system, the operation of an IHS may be monitored and managed remotely.

In a data center environment, rack-mounted server IHSs may utilize telemetry systems that collect metric data from a variety of different sources. Administrators may utilize the data collected by such telemetry systems in diagnosing errors or other events of interest related to an IHS. A data center may include a large number of IHSs, such as servers that are installed within chassis and stacked within slots provided by racks. A data center may include large numbers of such racks that may be organized into aisles with racks lining each side. Data centers organized in this manner may be designed to provide administrators with a uniform environment, but certain conditions may vary significantly within a data center.

SUMMARY

In various embodiments, methods are provided for utilizing telemetry data to identify zones within a data center comprised of a plurality of IHSs (Information Handling Systems). The methods may include: collecting metric data from the plurality of IHSs, wherein the metric data collected from each of the respective IHSs identifies a location of the respective IHS within the data center; analyzing the collected metric data to identify a first metric that is correlated with locations within the data center; within the first metric data, identifying a first zone of the data center that comprises a subset of the plurality of IHSs that reported anomalous first metric data relative to neighboring IHSs; and adjusting operations of the data center within the first zone in order to address the anomalous readings of the first metric data by the subset of IHSs.

In additional method embodiments, the metric data is collected by a remote access controller operating within each of the plurality of IHSs. In additional method embodiments, the remote access controller collects the metric data from IHS components via sideband management connections with the IHS components. In additional method embodiments, the correlation of the first metric with data center locations is identified based on principal component analysis of the collected metric data. In additional method embodiments, the first zone of the data center that includes a subset of IHSs reporting anomalous first metric data relative to neighboring IHSs comprises a rack housing the subset of IHSs. In additional method embodiments, the first zone of the data center that includes a subset of IHSs reporting anomalous first metric data relative to neighboring IHSs comprises one or more rows that span a plurality of adjacent racks of the data center. In additional embodiments, the methods may further include segmenting the first metric data to identify intervals of variations in the first metric data. In additional method embodiments, the first metric data comprises a temperature metric and wherein the adjustment to data center operations comprises increasing the cooling delivered by the data center within the first zone. In additional method embodiments, the first metric data comprises a power metric and wherein the first zone comprises a rack housing the subset of IHSs. In additional method embodiments, the first metric data comprises a network metric and wherein the first zone comprises a rack housing the subset of IHSs.

In various additional embodiments, systems are provided for utilizing telemetry data to identify zones within a data center. The systems may include: a plurality of IHSs (Information Handling Systems), each respective IHS comprising a remote access controller providing remote management of the respective IHS, wherein the plurality of IHSs are configured to report metric data, and wherein the metric data reported by each respective IHS identifies a location of the respective IHS within the data center; and a remote management application configured to: analyze the reported metric data to identify a first metric that is correlated with locations within the data center; within the first metric data, identify a first zone of the data center that comprises a subset of the plurality of IHSs that reported anomalous first metric data relative to neighboring IHSs; and adjust operations of the data center within the first zone in order to address the anomalous readings of the first metric data by the subset of IHSs.

In additional system embodiments, the remote access controller of each respective IHS collects the metric data from IHS components via sideband management connections with the IHS components. In additional system embodiments, the correlation of the first metric with data center locations is identified based on principal component analysis of the collected metric data. In additional system embodiments, the first zone of the data center that includes a subset of IHSs reporting anomalous first metric data relative to neighboring IHSs comprises a rack housing the subset of IHSs. In additional system embodiments, the first zone of the data center that includes a subset of IHSs reporting anomalous first metric data relative to neighboring IHSs comprises one or more rows that span a plurality of adjacent racks of the data center.

In various additional embodiments, computer-readable storage devices include instructions stored thereon for utilizing telemetry data to identify zones within a data center comprised of a plurality of IHSs (Information Handling Systems). Upon execution by one or more processors, the may instructions cause the one or more processors to: analyze metric data collected from the plurality of IHSs, wherein the metric data collected from each of the respective IHSs identifies a location of the respective IHS within the data center, and wherein the collected metric data is analyzed to identify a first metric that is correlated with locations within the data center; within the first metric data, identify a first zone of the data center that comprises a subset of the plurality of IHSs that reported anomalous first metric data relative to neighboring IHSs; and adjust operations of the data center within the first zone in order to address the anomalous readings of the first metric data by the subset of IHSs.

In additional storage device embodiments, a remote access controller of each respective IHS collects the metric data from IHS components via sideband management connections with the IHS components. In additional storage device embodiments, the correlation of the first metric with data center locations is identified based on principal component analysis of the collected metric data. In additional storage device embodiments, the first zone of the data center that includes a subset of IHSs reporting anomalous first metric data relative to neighboring IHSs comprises a rack housing the subset of IHSs. In additional storage device embodiments, the first zone of the data center that includes a subset of IHSs reporting anomalous first metric data relative to neighboring IHSs comprises one or more rows that span a plurality of adjacent racks of the data center.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

Figure 1:
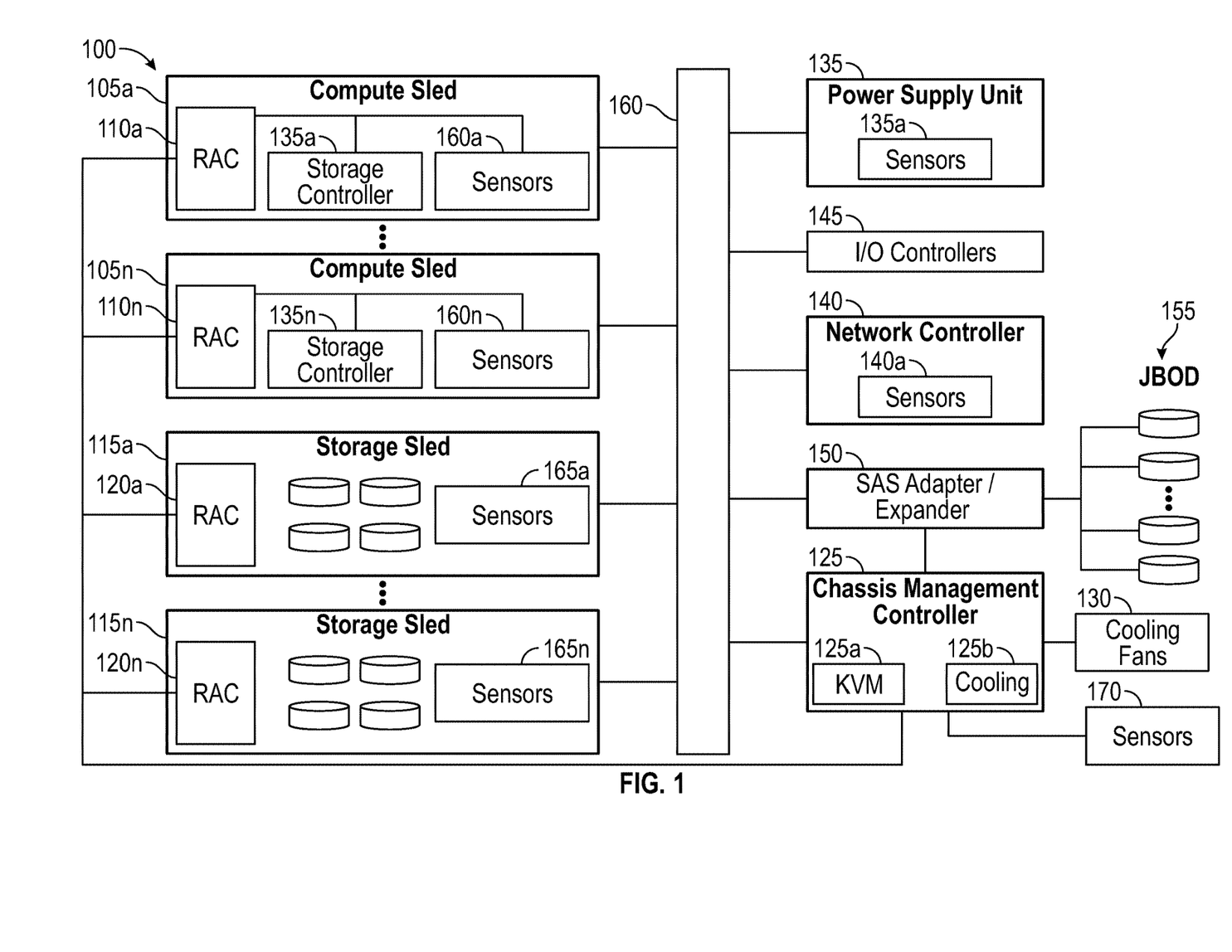
FIG. 1 is a diagram illustrating certain components of a chassis, according to some embodiments, supporting a telemetry system used for identification of zones within a data center.

FIG. 1 is a block diagram illustrating certain components of a chassis 100 comprising one or more compute sleds 105a-n and one or more storage sleds 115a-n that may be configured to implement the systems and methods described herein for supporting a telemetry system used for identification of zones within a data center. Chassis 100 may include one or more bays that each receive an individual sled (that may be additionally or alternatively referred to as a tray, blade, server, drive and/or node), such as compute sleds 105a-n and storage sleds 115a-n. Chassis 100 may support a variety of different numbers (e.g., 4, 8, 16, 32), sizes (e.g., single-width, double-width) and physical configurations of bays. Other embodiments may include additional types of sleds that provide various types of storage and/or processing capabilities. Other types of sleds may provide power management and networking functions. Sleds may be individually installed and removed from the chassis 100, thus allowing the computing and storage capabilities of a chassis to be reconfigured by swapping the sleds with different types of sleds, in many cases without affecting the ongoing operations of the other sleds installed in the chassis 100.

Multiple chassis 100 are typically housed within a rack, with each chassis installed in one or more slots of the rack. Data centers may utilize large numbers of racks, with various different types of chassis installed in the various rack configurations. The modular architecture provided by the sleds, chassis and rack allow for certain resources, such as cooling, power and network bandwidth, to be shared by the compute sleds 105a-n and storage sleds 115a-n, thus providing efficiency and supporting various types of computational loads.

Chassis 100 may be installed within a rack that provides all or part of the cooling utilized by chassis 100. For airflow cooling, a rack may include one or more banks of cooling fans that may be operated to ventilate heated air from within the chassis 100 that is housed within the rack. The chassis 100 may alternatively or additionally include one or more cooling fans 130 that may be similarly operated to ventilate heated air from within the sleds 105a-n, 115a-n that are installed within the chassis. A rack and a chassis 100 installed within the rack may utilize various configurations and combinations of cooling fans to cool the sleds 105a-n, 115a-n and other components housed within chassis 100.

The sleds 105a-n, 115a-n may be individually coupled to chassis 100 via connectors that correspond to connectors provided by front-facing bays of the chassis 100, where these connectors physically and electrically couple an individual sled to a backplane 160 of the chassis, where the backplane may be additionally or alternatively be referred to as a midplane. Chassis backplane 160 may be a printed circuit board that includes electrical traces and connectors that are configured to route signals between components of chassis 100 that are connected to the backplane 160. In various embodiments, backplane 160 may include various additional components, such as cables, wires, connectors, expansion slots, and multiplexers. In certain embodiments, backplane 160 may be a motherboard that includes various electronic components installed thereon. Such components installed on a motherboard backplane 160 may include components that implement all or part of the functions described with regard to the SAS (Serial Attached SCSI) expander 150, I/O controllers 145, network controller 145 and power supply unit 135.

Figure 2:
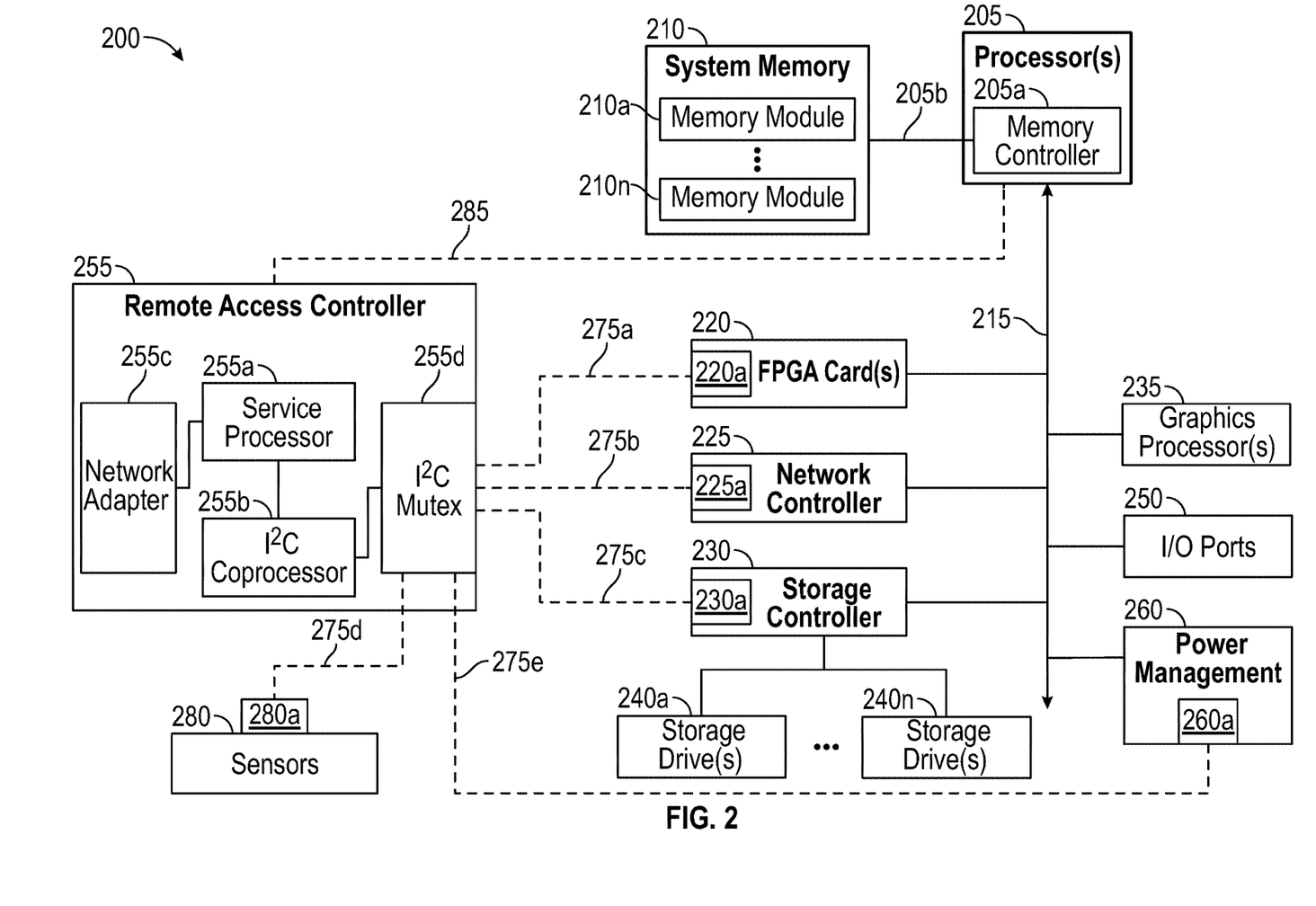
FIG. 2 is a diagram illustrating certain components of an IHS configured as a component of chassis, according to some embodiments, supporting a telemetry system used for identification of zones within a data center.

In certain embodiments, a compute sled 105a-n may be an IHS such as described with regard to IHS 200 of FIG. 2. A compute sled 105a-n may provide computational processing resources that may be used to support a variety of e-commerce, multimedia, business and scientific computing applications, such as services provided via a cloud implementation. Compute sleds 105a-n are typically configured with hardware and software that provide leading-edge computational capabilities. Accordingly, services provided using such computing capabilities are typically provided as high-availability systems that operate with minimum downtime. As described in additional detail with regard to FIG. 2, compute sleds 105a-n may be configured for general-purpose computing or may be optimized for specific computing tasks.

As illustrated, each compute sled 105a-n includes a remote access controller (RAC) 110a-n. As described in additional detail with regard to FIG. 2, each remote access controller 110a-n provides capabilities for remote monitoring and management of compute sled 105a-n. In support of these monitoring and management functions, remote access controllers 110a-n may utilize both in-band and sideband (i.e., out-of-band) communications with various components of a compute sled 105a-n and chassis 100. As illustrated, each compute sled 105a-n may include one or more sensors 160a-n. As described in additional detail below, the sensors 160a-n may generate various types of metric data that characterize aspects of the operation of a respective compute sled 105a-n. For instance, sensors 160a-n may collect metric data characterizing the performance of processing, networking, power and/or memory components of a compute sled 105a-n, as well as monitoring environmental properties, such as compute sled temperatures. Using collected metric data, each remote access controller 110a-n may implement various monitoring and administrative functions related to compute sleds 105a-n. Metric data received from these components may also be stored for further analysis, in some instances by the remote access controllers 110a-n. As described in additional detail below, the metric data collected by remote access controllers 110a-n may be collectively analyzed along with metric data collected from other remote access controllers operating within the same data center in order to identify zones within the data center that exhibit metric data deviations.

Each of the compute sleds 105a-n includes a storage controller 135a-n that may be utilized to access storage drives that are accessible via chassis 100. Some of the individual storage controllers 135a-n may provide support for RAID (Redundant Array of Independent Disks) configurations of logical and physical storage drives, such as storage drives provided by storage sleds 115a-n. In some embodiments, some or all of the individual storage controllers 135a-n may be HBAs (Host Bus Adapters) that provide more limited capabilities in accessing physical storage drives provided via storage sleds 115a-n and/or via SAS expander 150.

As illustrated, chassis 100 also includes one or more storage sleds 115a-n that are coupled to the backplane 160 and installed within one or more bays of chassis 100 in a similar manner to compute sleds 105a-n. Each of the individual storage sleds 115a-n may include various different numbers and types of storage devices. For instance, storage sleds 115a-n may include SAS (Serial Attached SCSI) magnetic disk drives, SATA (Serial Advanced Technology Attachment) magnetic disk drives, solid-state drives (SSDs) and other types of storage drives in various combinations. The storage sleds 115a-n may be utilized in various storage configurations by the compute sleds 105a-n that are coupled to chassis 100. As illustrated, each storage sled 115a-n may include one or more sensors 165a-n. The sensors 165a-n may generate various types of metric data that characterize aspects of the operation of a respective storage sled 115a-n. For instance, sensors 165a-n may collect metric data characterizing the performance of a storage sled 115a-n, such as data transfer rates and hard disk drive RPMs, as well as monitoring environmental properties, such as storage sled temperatures. As illustrated, each storage sleds 115a-n includes a remote access controller (RAC) 120a-n. As described in additional detail below, storage sleds 115a-n, or a storage controller 135a-n that manages access to storage sleds 115a-n, may be configured to generate and report this metric data to the remote access controller 120a-n, which may analyze and store the metric data. As described in additional detail below, the metric data collected by remote access controllers 120a-n may be collectively analyzed along with metric data collected from other remote access controllers operating within the same data center in order to identify zones within the data center that exhibit metric data deviations.

In addition to the data storage capabilities provided by storage sleds 115a-n, chassis 100 may provide access to other storage resources that may be installed components of chassis 100 and/or may be installed elsewhere within a rack housing the chassis 100, such as within a storage blade. In certain scenarios, such storage resources 155 may be accessed via a SAS expander 150 that is coupled to the backplane 160 of the chassis 100. The SAS expander 150 may support connections to a number of JBOD (Just a Bunch Of Disks) storage drives 155 that may be configured and managed individually and without implementing data redundancy across the various drives 155. The additional storage resources 155 may also be at various other locations within a datacenter in which chassis 100 is installed. Such additional storage resources 155 may also be remotely located.

As illustrated, the chassis 100 of FIG. 1 includes a network controller 140 that provides network access to the sleds 105a-n, 115a-n installed within the chassis. Network controller 140 may include various switches, adapters, controllers and couplings used to connect chassis 100 to a network, either directly or via additional networking components and connections provided via a rack in which chassis 100 is installed. In some embodiments, the network bandwidth provided to chassis 100 by network controller 140 may in turn be provided via a network device of a rack in which chassis 100 is installed. For instance, the rack may include a network switch, or other network routing device, that partitions an allotment of network bandwidth to some or all of the chassis that are installed within the rack. In such instances, network controller 140 may operate using an allotment of bandwidth provided by such a rack-mounted network switch, with network controllers in other chassis installed within the same rack as chassis 100 also operating using an allotment of network bandwidth provided by the network switch.

As with compute sleds 105a-n and storage sleds 115a-n, network controller 140 may include one or more sensors 140*a* that may include physical sensors, such as a temperature sensor providing thermal metrics, and logical sensors, such as capabilities reporting metrics of input and output data transfer rates. In some embodiments, such data transfer rates may be reported for individual ports or via logically grouped ports of the network controller. As with the sensors of compute sleds 105*a-n* and storage sleds 115*a-n*, the sensors 140*a* of network controller 140 may be configured to generate and report this sensor metric data. In various embodiments, the metric data reported by network controller 140 may be collectively analyzed along with other metric data collected within the same data center in order to identify zones within the data center that exhibit metric data deviations.

Chassis 100 may similarly include a power supply unit 135 that provides the components of the chassis with various levels of DC power from an AC power source or from power delivered via a power system provided by a rack within which chassis 100 may be installed. In certain embodiments, power supply unit 135 may be implemented within a sled that provides chassis 100 with redundant, hot-swappable power supply units. In some embodiments, the power provided to chassis 100 by power supply unit 135 may in turn be provided via a power supply of a rack in which chassis 100 is installed. In such instances, power supply unit 135 may operate using an allotment of power provided by the power supply of a rack in which chassis 100 is installed, with power supply units of other chassis installed within the same rack as chassis 100 also operating using an allotment of power provided by the rack.

As illustrated, power supply unit 135 may include one or more sensors 135*a* that may include physical sensors, such as a temperature sensor providing thermal and power output metrics, and logical sensors, such as capabilities that report discrete power settings. As above, the sensors 135*a* of power supply unit 135 may be configured to generate and report metric data. In various embodiments, the metric data reported by power supply unit 135 may be collectively analyzed along with other metric data collected within the same data center in order to identify zones within the data center that exhibit metric data deviations.

Chassis 100 may also include various I/O controllers 145 that may support various I/O ports, such as USB ports that may be used to support keyboard and mouse inputs and/or video display capabilities. Such I/O controllers 145 may be utilized by a chassis management controller 125 to support various KVM (Keyboard, Video and Mouse) 125*a* capabilities that provide administrators with the ability to interface with the chassis 100. In addition to providing support for KVM 125*a* capabilities for administering chassis 100, chassis management controller 125 may support various additional functions for sharing the infrastructure resources of chassis 100. In some scenarios, chassis management controller 125 may implement tools for managing the power 135, network bandwidth 140 and airflow cooling 130 that are available via the chassis 100. As described, the airflow cooling 130 utilized by chassis 100 may include an airflow cooling system that is provided by a rack in which the chassis 100 may be installed and managed by a cooling module 125*b* of the chassis management controller 125. In some embodiments, the operations of a chassis management controller 125 may be implemented by one of the compute sled or storage sled remote access controllers 110*a-n*, 120*a-n* that has been designated and configured for managing chassis-level configurations. In some embodiments, chassis management controller 125 may receive metric reports from one or more sensors 170 that are components of chassis 100, such as temperature sensors at various chassis locations that provide inlet and exhaust temperature measurements. In such embodiments, such chassis sensors 170 be configured to generate and report metric data. In various embodiments, the metric data reported by chassis sensors 170 may be collectively analyzed along with other metric data collected within the same data center in order to identify zones within the data center that exhibit metric data deviations.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. As described, an IHS may also include one or more buses operable to transmit communications between the various hardware components. An example of an IHS is described in more detail below.

FIG. 2 shows an example of an IHS 200 configured to implement systems and methods described herein for supporting a telemetry system used for identification of zones within a data center. It should be appreciated that although the embodiments described herein may describe an IHS that is a compute sled, server or similar computing component that may be deployed within a rack-mounted chassis, other embodiments may be utilized with other types of IHSs. In the illustrative embodiment of FIG. 2, IHS 200 may be a computing component, such as compute sled 105*a-n*, that is configured to share infrastructure resources provided by a chassis 100. In some embodiments, IHS 200 may be a server, such as a 1RU (Rack Unit) server, that is installed within a slot of a chassis, such as a 2RU chassis, with another 1RU IHS server installed in the other slot of the chassis.

The IHS 200 of FIG. 2 may be a compute sled, such as compute sleds 105*a-n* of FIG. 1, that may be installed within a chassis, that may in turn be installed within a rack. Installed in this manner, IHS 200 may utilized shared power, network and cooling resources provided by the chassis and/or rack. IHS 200 may utilize one or more processors 205. In some embodiments, processors 205 may include a main processor and a co-processor, each of which may include a plurality of processing cores that, in certain scenarios, may be used in operating multiple virtualized computing environments. In certain embodiments, one or all of processor(s) 205 may be graphics processing units (GPUs) in scenarios where IHS 200 has been configured to support functions such as multimedia services and graphics applications.

In some embodiments, processor 205 may be configured to operate as a source of metric data providing physical sensor data, such as junction temperatures and power consumption. Processor 205 may also be configured to operate as a source logical sensor data, such as remaining CPU processing capacity. In some embodiments, processor 205 may be configured by remote access controller 255 to generate metrics that are reported to the remote access controller, where the configuration and reporting of this metric data may be via a PECI (Platform Environment Control Interface) bus 285 operations. Processor 205 may be configured to generate and report such metric data to remote access controller 255 for analysis and storage. As described in additional detail below, upon being stored, metric data generated by processor 205 may be collectively analyzed along with other metric data collected within the same data center in order to identify zones within the data center that exhibit metric data deviations.

As illustrated, processor(s) 205 includes an integrated memory controller 205a that may be implemented directly within the circuitry of the processor 205, or the memory controller 205a may be a separate integrated circuit that is located on the same die as the processor 205. The memory controller 205a may be configured to manage the transfer of data to and from the system memory 210 of the IHS 200 via a high-speed memory interface 205b. In some embodiments, memory controller 205a may be configured to operate as a source of metric data capable of generating metric reports that are reported to remote access controller 255. The metric data reported by memory controller 205a may include metrics such as the amount of available system memory 210 and memory transfer rates via memory interface 205b. The metric reporting capabilities of memory controller 205a may be configured to generate and report such metric data, to remote access controller 255 for analysis and storage. As described in additional detail below, upon being stored, metric data generated by memory controller 205a may be collectively analyzed along with other metric data collected within the same data center in order to identify zones within the data center that exhibit metric data deviations.

The system memory 210 is coupled to processor(s) 205 via a memory bus 205b that provides the processor(s) 205 with high-speed memory used in the execution of computer program instructions by the processor(s) 205. Accordingly, system memory 210 may include memory components, such as such as static RAM (SRAM), dynamic RAM (DRAM), NAND Flash memory, suitable for supporting high-speed memory operations by the processor(s) 205. In certain embodiments, system memory 210 may combine both persistent, non-volatile memory and volatile memory. In certain embodiments, the system memory 210 may be comprised of multiple removable memory modules. The system memory 210 of the illustrated embodiment includes removable memory modules 210a-n. Each of the removable memory modules 210a-n may correspond to a printed circuit board memory socket that receives a specific type of removable memory module 210a-n, such as a DIMM (Dual In-line Memory Module), that can be coupled to the socket and then decoupled from the socket as needed, such as to upgrade memory capabilities or to replace faulty components. Other embodiments of IHS system memory 210 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 200 may utilize a chipset that may be implemented by integrated circuits that are connected to each processor 205. All or portions of the chipset may be implemented directly within the integrated circuitry of an individual processor 205. The chipset may provide the processor(s) 205 with access to a variety of resources accessible via one or more buses 215. Various embodiments may utilize any number of buses to provide the illustrated pathways served by bus 215. In certain embodiments, bus 215 may include a PCIe (PCI Express) switch fabric that is accessed via a PCIe root complex. IHS 200 may also include one or more I/O ports 250, such as PCIe ports, that may be used to couple the IHS 200 directly to other IHSs, storage resources or other peripheral components.

In certain embodiments, a graphics processor 235 may be comprised within one or more video or graphics cards, or an embedded controller, installed as components of the IHS 200. In certain embodiments, graphics processor 235 may be an integrated of the remote access controller 255 and may be utilized to support the display of diagnostic and administrative interfaces related to IHS 200 via display devices that are coupled, either directly or remotely, to remote access controller 255.

In the illustrated embodiment, processor(s) 205 is coupled to a network controller 225, such as provided by a Network Interface Controller (NIC) that is coupled to the IHS 200 and allows the IHS 200 to communicate via an external network, such as the Internet or a LAN. As with the network controller of FIG. 1, network controller 225 may operate using an allotment of bandwidth from a shared pool provided by the rack and/or chassis in which IHS 200 is installed. As illustrated, network controller 225 may be instrumented with a controller or other logic unit 225a that supports a sideband management connection 275b with remote access controller 255. Via the sideband management connection 275b, network controller 225 may be configured to operate as a source of metric data that may include environmental metrics, such as a temperature measurements, and logical sensors, such as metrics reporting input and output data transfer rates. Network controller 225 may be configured to generate and report such metric data to remote access controller 255 for analysis and storage. As described in additional detail below, upon being stored, metric data generated by network controller 255 may be collectively analyzed along with other metric data collected within the same data center in order to identify zones within the data center that exhibit metric data deviations.

Processor(s) 205 may also be coupled to a power management unit 260 that may interface with the power system unit 135 of the chassis 100 in which IHS 200 may be installed. As with network controller 225, power management unit 260 may be instrumented with a controller or other logic unit 260a that supports a sideband management connection 275e with remote access controller 255. Via the sideband management connection 275e, power management unit 260 may be configured to operate as a source of metric data that may include physical sensors, such as a sensors providing temperature measurements and sensors providing power output measurements, and logical sensors, such as capabilities reporting discrete power settings. Power management unit 260 may be configured to generate and report such metric data to remote access controller 255 for analysis and storage. As described in additional detail below, upon being stored, metric data generated by power management unit 260 may be collectively analyzed along with other metric data collected within the same data center in order to identify zones within the data center that exhibit metric data deviations.

As illustrated, IHS 200 may include one or more FPGA (Field-Programmable Gate Array) card(s) 220. Each FPGA card 220 supported by IHS 200 may include various processing and memory resources, in addition to an FPGA integrated circuit that may be reconfigured after deployment of IHS 200 through programming functions supported by the FPGA card 220. FGPA card 220 may be optimized to perform specific processing tasks, such as specific signal processing, security, data mining, and artificial intelligence functions, and/or to support specific hardware coupled to IHS 200. FPGA card 220 may include one or more physical and/or logical sensors. As specialized computing components, FPGA cards may be used to support large-scale computational tasks that may result in the FPGA card 220 generating significant amounts of heat. In order to protect specialized FPGA cards from damaging levels of heat, FPGA card 220 may be outfitted with multiple temperature sensors. FPGA card 220 may also include logical sensors that are sources of metric data, such as metrics reporting numbers of calculations performed by the programmed circuitry of the FPGA. The FPGA card 220 may also include a management controller 220a that may support interoperation was the remote access controller 255 via a sideband device management bus 275a. The management controller 220a of FPGA card 220 may be configured to generate and report metric data to remote access controller 255 for analysis and storage. As described in additional detail below, upon being stored, metric data generated by FPGA card 220 may be collectively analyzed along with other metric data collected within the same data center in order to identify zones within the data center that exhibit metric data deviations.

In certain embodiments, IHS 200 may operate using a BIOS (Basic Input/Output System) that may be stored in a non-volatile memory accessible by the processor(s) 205. The BIOS may provide an abstraction layer by which the operating system of the IHS 200 interfaces with the hardware components of the IHS. Upon powering or restarting IHS 200, processor(s) 205 may utilize BIOS instructions to initialize and test hardware components coupled to the IHS, including both components permanently installed as components of the motherboard of IHS 200 and removable components installed within various expansion slots supported by the IHS 200. The BIOS instructions may also load an operating system for use by the IHS 200. In certain embodiments, IHS 200 may utilize Unified Extensible Firmware Interface (UEFI) in addition to or instead of a BIOS. In certain embodiments, the functions provided by a BIOS may be implemented, in full or in part, by the remote access controller 255.

IHS 200 may include one or more storage controllers 230 that may be utilized to access storage drives 240a-n that are accessible via the chassis in which IHS 100 is installed. Storage controller 230 may provide support for RAID (Redundant Array of Independent Disks) configurations of logical and physical storage drives 240a-n. In some embodiments, storage controller 230 may be an HBA (Host Bus Adapter) that provides more limited capabilities in accessing physical storage drives 240a-n. In some embodiments, storage drives 240a-n may be replaceable, hot-swappable storage devices that are installed within bays provided by the chassis in which IHS 200 is installed. In some embodiments, storage drives 240a-n may also be accessed by other IHSs that are also installed within the same chassis as IHS 100. In embodiments where storage drives 240a-n are hot-swappable devices that are received by bays of chassis, the storage drives 240a-n may be coupled to IHS 200 via couplings between the bays of the chassis and a midplane of IHS 200. Storage drives 240a-n may include SAS (Serial Attached SCSI) magnetic disk drives, SATA (Serial Advanced Technology Attachment) magnetic disk drives, solid-state drives (SSDs) and other types of storage drives in various combinations.

As illustrated, storage controller 230 may be instrumented with a controller or other logic unit 230a that supports a sideband management connection 275c with remote access controller 255. Via the sideband management connection 275c, storage controller 230 may be configured to operate as a source of metric data regarding the operation of storage drives 240a-n. For instance, controller 230a may collect metric data characterizing the performance of individual storage drives 240a-n, such as available storage capacity and data transfer rates, as well as environmental properties, such as storage drive temperatures. A controller or other logic unit 230a of storage controller 230 may be configured to generate and report such metric data to remote access controller 255 for analysis and storage. As described in additional detail below, upon being stored, metric data generated by storage controller 230 may be collectively analyzed along with other metric data collected within the same data center in order to identify zones within the data center that exhibit metric data deviations.

In certain embodiments, remote access controller 255 may operate from a different power plane from the processors 205 and other components of IHS 200, thus allowing the remote access controller 255 to operate, and management tasks to proceed, while the processing cores of IHS 200 are powered off. As described, various functions provided by the BIOS, including launching the operating system of the IHS 200, may be implemented by the remote access controller 255. In some embodiments, the remote access controller 255 may perform various functions to verify the integrity of the IHS 200 and its hardware components prior to initialization of the IHS 200 (i.e., in a bare-metal state).

As described, IHS 200 may be a server that is installed within a rack of a data center that may house numerous other racks, each housing additional servers. In some embodiments, upon initial configuration of IHS 200 for operations with a particular data center, a data center management application utilized by administrators of the data center may be include capabilities for configuring remote access controller 255 for remote management of IHS 200. In some embodiments, such a data center management application may operate on an IHS such as IHS 200 that has been designated to support administrative operations within a datacenter. As part of the initial configuration of IHS 200 for operation within a data center, the data center management application may provide remote access controller 255 with information specifying the installed location of IHS 200 within the data center. As described in additional detail below, the data center management application may provide remote access controller 255 with information identifying the rack in which IHS 200 is installed, the position of IHS 200 within this rack, the location of this rack within an aisle of racks, and the location of the aisle with a data center. As describe in additional detail below, remote access controller 255 may include this location information within metric reports collected from the components of IHS 200. This location information may then be utilized to by the data center management application in identifying zones within the data center that include IHSs that are exhibiting deviations in reported metrics relative to the metrics reported from IHSs in neighboring zones.

In some embodiments, remote access controller 255 may also be directly coupled via I2C couplings 275d with one or more sensors 280, such as sensors that provide measurements of ambient inlet temperatures, outlet airflow temperatures and temperatures at various locations within IHS 200. Sensors 280 coupled directly to remote access controller 255 may also be used in implementing security protocols, such as intrusion detection sensors and user proximity sensors. Sensors 280 may include logic units or other controllers 280a that are be configured by remote access controller 255 to generate and report metric data, where the generated metric data may be collectively analyzed along with other metric data collected within the same data center in order to identify zones within the data center that exhibit metric data deviations.

Remote access controller 255 may include a service processor 255a, or specialized microcontroller, that operates management software that supports remote monitoring and administration of IHS 200. Remote access controller 255 may be installed on the motherboard of IHS 200 or may be coupled to IHS 200 via an expansion slot provided by the motherboard. In support of remote monitoring functions, network adapter 225c may support connections with remote access controller 255 using wired and/or wireless network connections via a variety of network technologies. As a non-limiting example of a remote access controller, the integrated Dell Remote Access Controller (iDRAC) from Dell® is embedded within Dell PowerEdge™ servers and provides functionality that helps information technology (IT) administrators deploy, update, monitor, and maintain servers remotely.

In some embodiments, remote access controller 255 may support monitoring and administration of various managed devices 220, 225, 230, 260, 280 of an IHS via a sideband bus interface. For instance, messages utilized in device management may be transmitted using I2C sideband bus connections 275a-e that may be individually established with each of the respective managed devices 220, 225, 230, 260, 280 through the operation of an I2C multiplexer 255d of the remote access controller. As illustrated, certain of the managed devices of IHS 200, such as FPGA cards 220, network controller 225, storage controller 230 and power management unit 260, are coupled to the IHS processor(s) 205 via an in-line bus 215, such as a PCIe root complex, that is separate from the I2C sideband bus connections 275a-e used for device management.

In certain embodiments, the service processor 255a of remote access controller 255 may rely on an I2C co-processor 255b to implement sideband I2C communications between the remote access controller 255 and managed components 220, 225, 230, 260, 280 of the IHS. The I2C co-processor 255b may be a specialized co-processor or micro-controller that is configured to interface via a sideband I2C bus interface with the managed hardware components 220, 225, 230, 260, 280 of IHS. In some embodiments, the I2C co-processor 255b may be an integrated component of the service processor 255a, such as a peripheral system-on-chip feature that may be provided by the service processor 255a. Each I2C bus 275a-e is illustrated as single line in FIG. 2. However, each I2C bus 275a-e may be comprised of a clock line and data line that couple the remote access controller 255 to I2C endpoints 220a, 225a, 230a, 260a, 280a on each of the managed components.

As illustrated, the I2C co-processor 255b may interface with the individual managed devices 220, 225, 230, 260, 280 via individual sideband I2C buses 275a-e selected through the operation of an I2C multiplexer 255d. Via switching operations by the I2C multiplexer 255d, a sideband bus connection 275a-e may be established by a direct coupling between the I2C co-processor 255b and an individual managed device 220, 225, 230, 260, 280. In providing sideband management capabilities, the I2C co-processor 255b may each interoperate with corresponding endpoint I2C controllers 220a, 225a, 230a, 260a, 280a that implement the I2C communications of the respective managed devices 220, 225, 230, 260, 280. The endpoint I2C controllers 220a, 225a, 230a, 260a, 280a may be implemented as dedicated microcontrollers for communicating sideband I2C messages with the remote access controller 255, or endpoint I2C controllers 220a, 225a, 230a, 260a, 280a may be integrated SoC functions of a processor of the respective managed device endpoints 220, 225, 230, 260, 280.

In various embodiments, an IHS 200 does not include each of the components shown in FIG. 2. In various embodiments, an IHS 200 may include various additional components in addition to those that are shown in FIG. 2. Furthermore, some components that are represented as separate components in FIG. 2 may in certain embodiments instead be integrated with other components. For example, in certain embodiments, all or a portion of the functionality provided by the illustrated components may instead be provided by components integrated into the one or more processor(s) 205 as a systems-on-a-chip.

Figure 3:
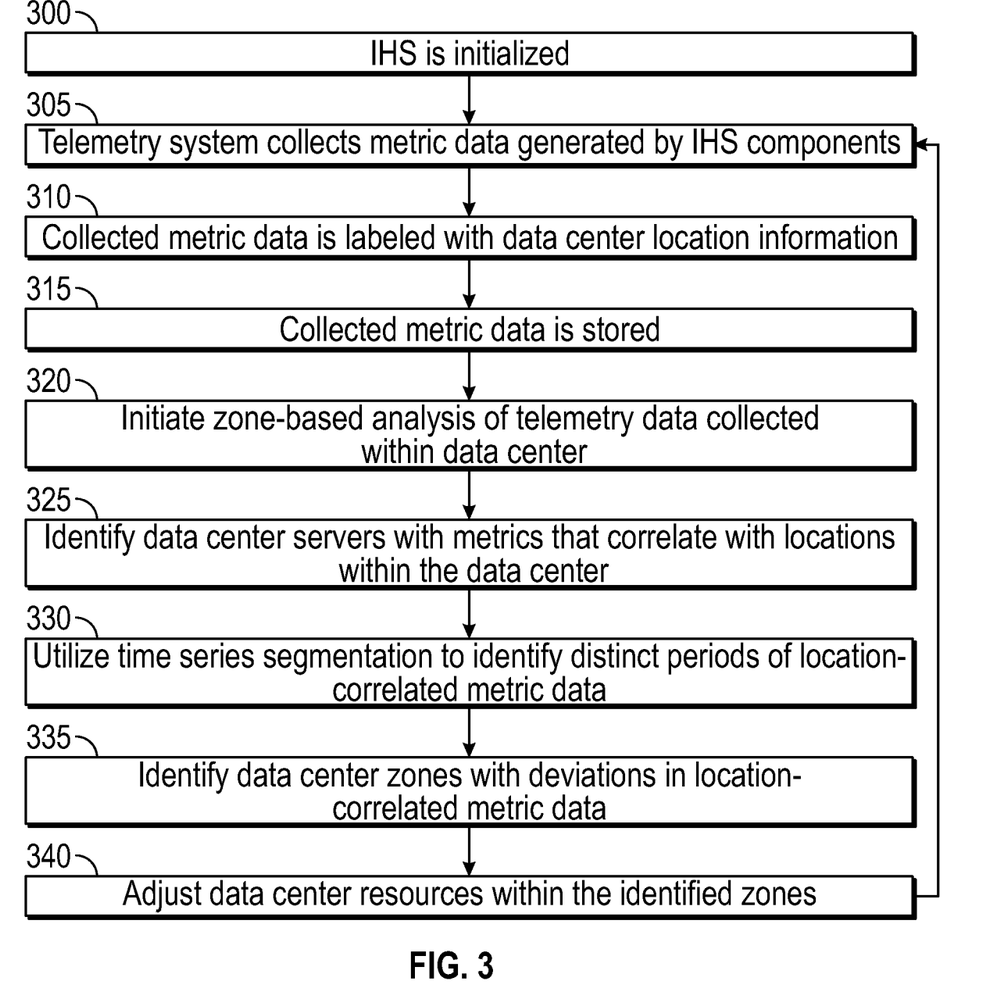
FIG. 3 is a flowchart describing certain steps of a method, according to some embodiments, for supporting a telemetry system used for identification of zones within a data center.

FIG. 3 is a flowchart describing certain steps of a method, according to some embodiments, for supporting a telemetry system used for identification of zones within a data center. Embodiments may begin at block 300 with the initialization of an IHS, such as the server IHSs described with regard to FIGS. 1 and 2. Upon being initialized, a wide variety of metric data may be collected by the telemetry system of an IHS. As described, various components of an IHS may be instrumented with physical and/or logical sensors that characterize various aspects of the operation of the IHS. In some embodiments, at block 305, a remote access controller of the IHS may receive metric data reported by the components of the IHS, such as via the sideband management connections described with regard to FIG. 2. Upon receipt of these metric reports, the remote access controller may evaluate some or all of the reports in order to identify conditions that warrant an immediate response. For instance, the remote access controller may evaluate reported temperature information in order to immediately identify scenarios were thermal thresholds for safe operation have been exceeded.

As described with regard to FIG. 1, remote access controllers operating in a data center environment may be configured with information specifying the installed location of the remote access controller within the data center. In some instances, this data center location information may be provided to the remote access controller operating within a server IHS upon initial installation of the server within a rack of a data center. For example, as part of installation and configuration of a server within a data center, a data center management application may configure the remote access controller of this server to conduct the described telemetry operations and may provide the remote access controller with the server's installed location within the data center. For instance, the location information may specify a name or label associated with the data center, as well as identifying a room or other area of the data center in which the server is installed. As described, rack structures that house servers may be organized into rows of racks such that aisles have racks of servers on one or both sides. Accordingly, the location information may specify an aisle of the data center. The location information may also identify the rack in which a server is installed. As described, servers are stacked within a rack structure, with multiple of these rack structures positioned side-by-side along the length of an aisle. In some instances, the location of servers that are stacked within racks may be identified based on the row (i.e. slot) of the rack in which the server is installed. For example, a server installed in the topmost slot of the rack may be identified as being installed in a top row, which may be designate as row 1. A server installed in the bottom slot of the rack that includes seven slots may be identified as being installed in the bottom row, which may be designate as row 7. Upon receiving metric data from various sources within a server IHS, remote access controller may add such location information to the metric reports in order to support location-based processing of the collected telemetry data. For example, the remote access controller may attach the location information as a descriptive label that is added to received metric reports.

Once the collected metric reports have been labeled with data center location information, at block 315, the remote access controller may store all or part of received metric reports to a database, or to one or more logs, for use in supporting additional analysis and troubleshooting of IHS operations, include the described analysis of telemetry data for use in identify zones of interest within a data center. At block 320, a data center management application may initiate the identification of data center zones based on the metric data collected and stored by various remote access controllers operating within the data center. In some embodiments, this data center management application may be configured to automatically initiate such processing on a periodic basis, such as once every hour, or may be configured to initiate such processing based on the detection of certain conditions, such as based on the detection of temperature thresholds being surpassed, or based on a detected error condition.

At block 325, the collected metric data may be analyzed in order to identify groups of servers that have reported metric data that is correlated with respect to a location of these servers within the data center. In some embodiments, principal component analysis may be used to identify the specific types of metric data that are correlated with data center location information, thus reducing the dimensionality of identifying metrics that are exhibiting location-based characteristics. For example, principal component analysis of collected metric information may reveal that reported inlet temperatures are correlated with the locations of the servers reporting the temperature information. More specifically, reported inlet temperatures may be determined to be correlated with location information that specifies the row within a rack in which servers are installed. In another example, reported outlet temperatures may be determined to be correlated with the individual racks of the data center. On the other hand, if no such location-based correlation is present, reported inlet temperatures may vary with no observable correlation to any location information. At block 330, the metric data that has been determined to be correlated with location information may be segmented into distinct periods, such as using a time segmentation algorithm. Based on such time segmentation analysis, distinct intervals of time with significant variations in reported metric values may be identified for further analysis and intervals without any such variations in reported metric values may be omitted from any additional analysis.

Once intervals of time with noteworthy metric reports that are correlated with location information have been identified, at block 355, data center zones associated with anomalous metric values may be identified. As described in additional detail below, this analysis may identify groups of servers that are installed in distinct data center zones, where these co-located groups of servers are exhibiting deviations in reported metrics in comparison to neighboring servers. In various scenarios, the data center zones identified as including servers that are reporting anomalous metric information may be individual racks, groups of adjacent racks, aisles of racks, a row (i.e., slot) of adjacent racks in which the groups of server are each installed and/or rooms within a datacenter. Upon identification of metric information that exhibits location-based anomalies, the identified data center zones and the deviation information may be utilized in adjusting operations of the data center. As described in additional detail below, at block 340, such adjustments may result in adjustments to the airflow cooling output within certain areas of a datacenter, configuration changes to datacenter resources such as networking and power, and/or replacement of components or systems that are determined to be the source of the identified deviations. After any such adjustments have been completed, the subsequently generated metric information may be analyzed in the described manner in order to determine if the location-based deviation in metric reports has been rectified.

Figure 4A:
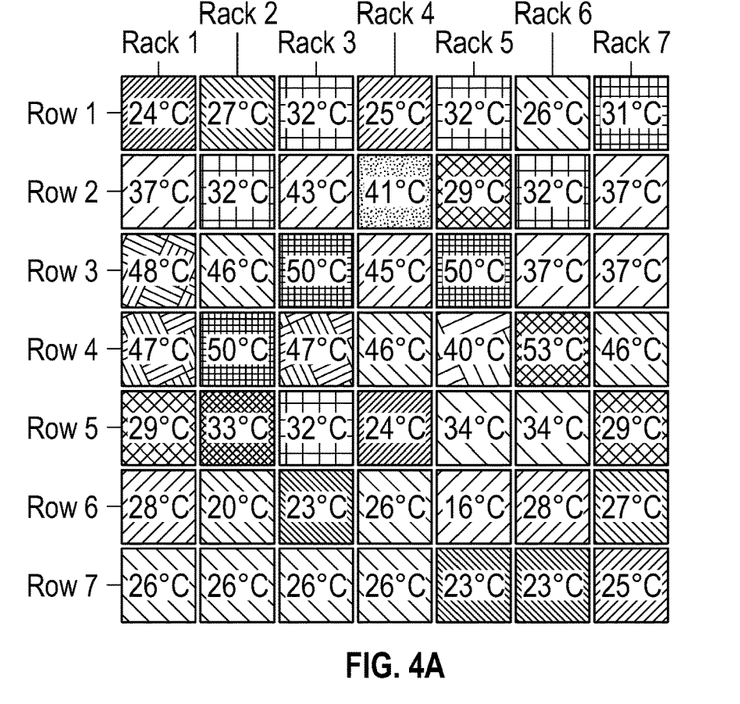
FIG. 4A is an illustration of an example, according to various embodiments, of the use of a telemetry system for the identification of an anomalous temperature zone within rows of a data center.

FIG. 4A is an illustration of an example, according to various embodiments, of the use of a telemetry system for the identification of an anomalous temperature zone within rows of a data center. In the illustrated example, temperature telemetry data, such as an inlet temperature or an exhaust temperature, has been identified as being correlated with data center location information. As described with regard to FIG. 3, principal component analysis of metric information collected from servers throughout a data center may be used to identify metrics that are correlated with data center locations. In the example of FIG. 4A, a temperature metric, such as an inlet temperature or exhaust temperature, reported by servers has been demonstrated to vary in relation to the location of a server within an aisle comprised of seven adjacent racks. Also as described with regard to FIG. 3, once a location-correlated metric has been identified, a time segmentation analysis of this metric data may be used to identify periods of particular interest within this data, such as the scenario illustrated in FIG. 4A where the average reported temperature over such an interval varies based on the row (i.e. slot) of the rack in which a server is installed. In some embodiments, the periods selected by the time segmentation analysis may be additionally based on events, such as error and/or warning conditions, reported by remote access controllers that have provided the metric data. For instance, a remote access controller may perform an initial analysis of metric data upon receipt in order to identify errors or other conditions that may result in notifications to administrators. In such instances, events detected by remote access controllers may be used in segmenting the reported metric data into intervals of interest.

As illustrated, the reported temperature information exhibits a deviation in temperatures reported by servers located in rows three and four of their respective racks. In some embodiments, such location-based deviations may be identified using techniques such as univariate anomaly detection algorithms. Although data centers may employ sophisticated systems for controlling ambient temperatures throughout a data center, scenarios may nonetheless arise where airflow patterns may result in zones that are not properly ventilated. For example, in the scenario illustrated in FIG. 4A, a data center may provide sufficient airflow for maintaining ambient inlet temperatures below a threshold, such as below 45 degrees Celsius, for all servers in the illustrated aisle, but a draft or other airflow pathway within the data center may result in the airflow provided to the illustrated aisle being pulled downward, thus providing excessive cooling to servers in lower rows, while bypassing the servers in rows three and four. Embodiments thus provide a system for utilizing collected metric information for identifying such anomalous temperature zones within a datacenter. Without this capability provided by embodiments, administrators may be provided with individual metric reports indicating elevated inlet temperatures by some of these servers in rows three and four, but may be unable to discern that all servers in these rows are experiencing elevated ambient temperatures. Using the information provided by embodiments, administrators may adjust the output of the data centers environmental cooling system, or otherwise address the ventilation issues causing the lack of airflow to servers in these rows. Embodiments may be further utilized to evaluate whether such modifications have resulted in reduced ambient temperatures within this particular data center zone.

Figure 4B:
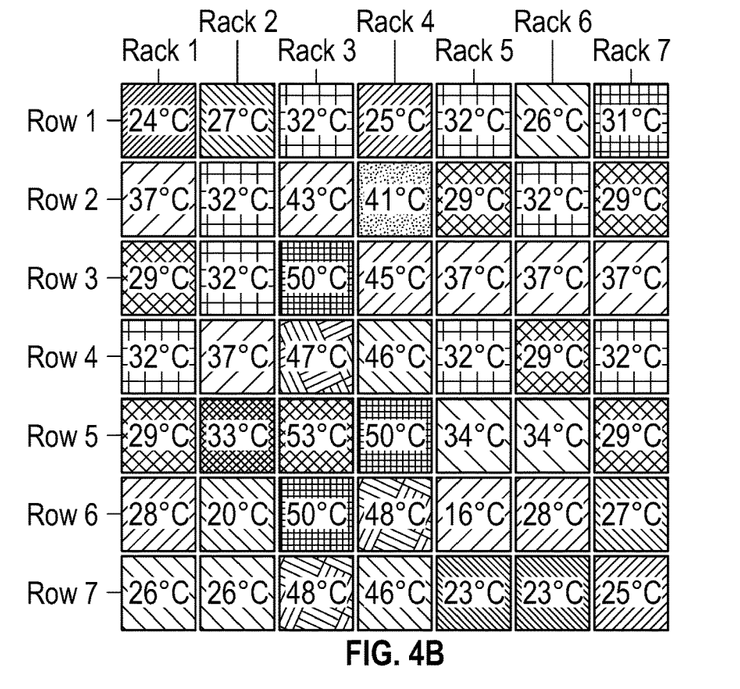
FIG. 4B is an illustration of an additional example, according to various embodiments, of the use of a telemetry system for the identification of an anomalous temperature zone within racks of a data center.

FIG. 4B is an illustration of an additional example, according to various embodiments, of the use of a telemetry system for the identification of an anomalous temperature zone within racks of a data center. As described, data centers may be used to support a large variety of data processing applications. One such application that may be implemented in a data center is a vSAN (virtual storage area network) that utilizes a pool of shared storage resources located within a logical cluster of servers. Although a vSAN system may utilize a logical cluster of servers, in some instances, these servers may be grouped in close physical proximity to each other within a data center. Such physical proximity may support high-speed connections between these servers.

In the example illustrated in FIG. 4B, the principal component analysis again identifies temperature metric information as being correlated with server locations within a data center. However, rather than identifying rows of servers reporting anomalous temperature data, in the example of FIG. 4B, the anomaly detection capabilities utilized by embodiments may identify elevated exhaust temperatures in servers located in racks three and four of the illustrated aisle of racks. In such a scenario, the servers may correspond to a cluster that is in use by a vSAN system, where the workload of this storage system and the configuration of these servers has resulted in elevated exhaust temperatures within this zone of the datacenter. Based on this information provided by embodiments, administrators may increase datacenter cooling to this aisle of the datacenter, or may adjust the airflow cooling output of these two particular racks, or may add additional servers to the cluster in use by the vSAN system in order to better distribute the workload of the system. Upon making such adjustments, administrators may utilize the capabilities provided by embodiments to evaluate whether such adjustments have addressed the anomalous exhaust temperatures in this zone of the data center.

Figure 5A:
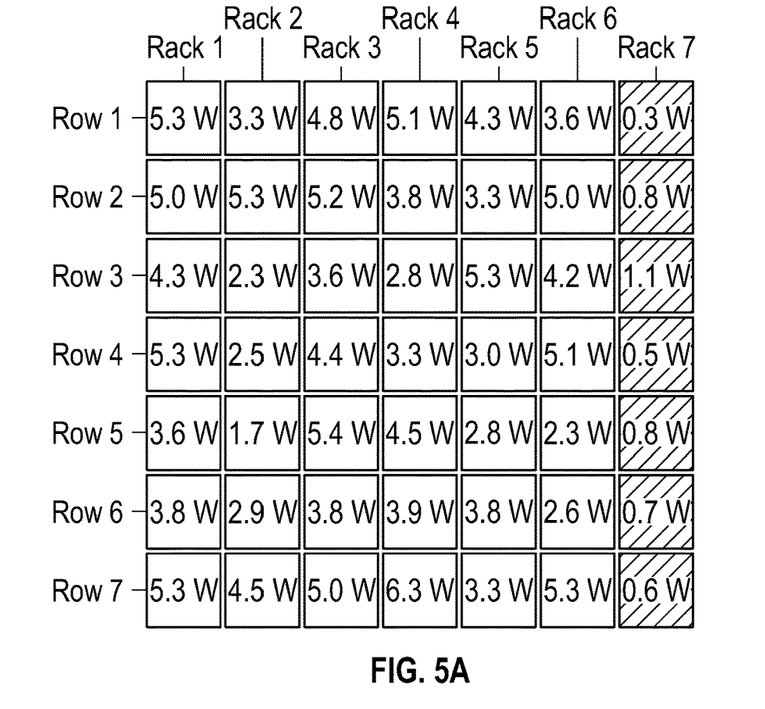
FIG. 5A is an illustration of an additional example, according to various embodiments, of the use of a telemetry system for the identification of an anomalous power zone within a rack of a data center.
Figure 5B:
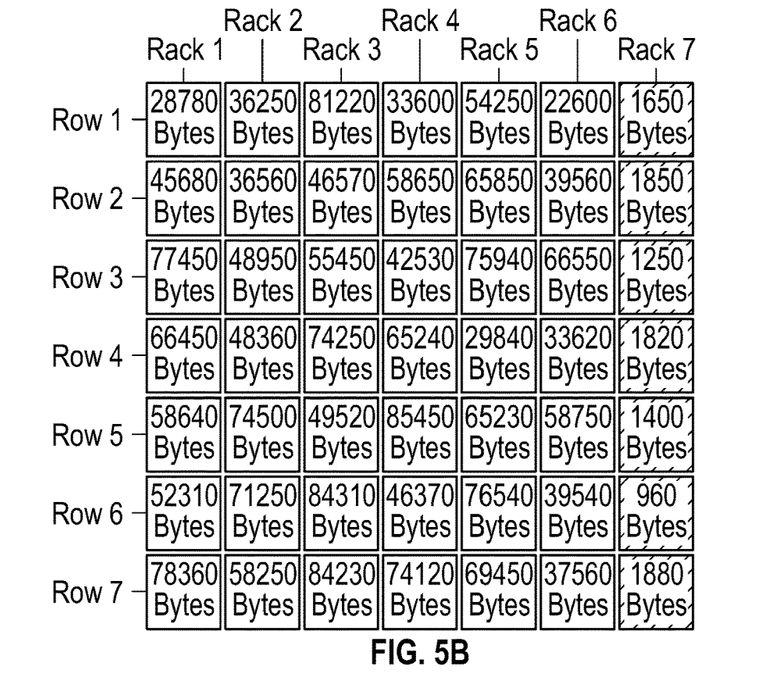
FIG. 5B is an illustration of an additional example, according to various embodiments, of the use of a telemetry system for the identification of an anomalous network zone within a rack of a data center.

FIG. 5A is an illustration of an additional example, according to various embodiments, of the use of a telemetry system for the identification of an anomalous power zone within a rack of a data center. In the example of FIG. 5B, rather than identify temperature information as being correlated with data center locations, the principal component analysis utilized by embodiments may identify a power availability metric as being correlated with location information. In particular, servers may report metrics providing a power availability, which may provide a measure of reserve power capacity that remains after the server has allocated available power. Such reserve power capacity may be used by the server to support short periods of peak power demands. However, as indicated in FIG. 5B, embodiments may identify servers in rack number seven as reporting abnormally low levels of reserve power capacity, thus limiting these server's ability to respond to peak power demands. As described above with regard to FIG. 1, servers may rely on shared power resources provided by the rack in which servers are installed. Accordingly, embodiments identifying the scenario illustrated in FIG. 5B may assist administrators in identifying power capacity issues in the power supply unit of rack seven.

FIG. 5B is an illustration of an additional example, according to various embodiments, of the use of a telemetry system for the identification of an anomalous network zone within a rack of a data center. Similar to the example of FIG. 5A, embodiments have identified a metric discrepancy that is associated with rack number seven of the illustrated aisle of servers. However, in the example of FIG. 5B, reported network transmission metrics have been determined to be correlated with server locations within this illustrated aisle of servers. Servers may report metric information that relates the number of bytes of data transmitted by each port of a network controller of a server. Such network controller metric information may be aggregated for all ports and all network controllers of a server in order to determine an aggregate number of bytes being transmitted by a server over a particular time interval. The principal component analysis utilized by embodiments may identify this network transmission information as being correlated with data center location information and the anomaly detection algorithms utilized by embodiments may identify the servers in rack number seven as exhibiting anomalous network transmission data that is lower than network transmission data in neighboring racks. As described with regard to FIG. 1, servers installed within a rack may utilize shared network resources provided by the rack, such as network bandwidth provided by a network switch of the rack. Embodiments provide a capability for identifying scenarios where particular network characteristics are adversely affected by problems in such shared networking resources. In this example, administrators may investigate whether issues with a network switch of rack number seven are causing the servers in this rack to be provided with limited network transmission bandwidth.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for utilizing telemetry data to identify zones within a data center comprised of a plurality of IHSs (Information Handling Systems), the method comprising:
collecting metric data from the plurality of IHSs operating at a plurality of locations within the data center, wherein the metric data collected from individual ones of the plurality of IHSs identifies a respective location of the respective IHS within the data center;
analyzing the data center locations of the IHSs specified in the collected metric data to identify a first metric of the metric data that is correlated with one or more locations of the plurality of locations within the data center;
based at least in part on the first metric that is correlated with the one or more data center locations, identifying a first zone of the data center that comprises a first subset of the plurality of IHSs, wherein a first subset of the metric data, collected from the first subset of the plurality of IHSs within the first zone of the data center, comprises anomalous metric data relative to a second subset of the metric data collected from neighboring IHSs; and
adjusting operations of the data center within the first zone of the data center, identified based at least in part on the first metric of the metric data collected from the individual IHSs that is correlated with the one or more data center locations, in order to address the anomalous metric data within the first subset of metric data collected from the first subset of IHSs.

2. The method of claim 1, wherein the metric data identifying the respective location of the respective IHSs within the data center is collected by a remote access controller operating within individual ones of the plurality of IHSs within the data center.

3. The method of claim 2, wherein the remote access controller collects the metric data from IHS components via sideband management connections with the IHS components.

4. The method of claim 1, wherein the correlation of the first metric with the one or more data center locations is identified based on a principal component analysis of the collected metric data.

5. The method of claim 1, wherein the first zone of the data center, that includes the first subset of IHSs within the data center reporting anomalous metric data relative to neighboring IHSs, comprises a rack housing the first subset of IHSs.

6. The method of claim 1, wherein the first zone of the data center, that includes the first subset of IHSs reporting anomalous metric data relative to neighboring IHSs within the data center, comprises one or more rows that span a plurality of adjacent racks of the data center.

7. The method of claim 1, further comprising, segmenting the first metric, that is correlated with the one or more data center locations, to identify intervals of variations in the first metric data.

8. The method of claim 1, wherein the first metric, that is correlated with the one or more data center locations, comprises a temperature metric, and wherein the adjustment to data center operations comprises increasing the cooling delivered by the data center within the first zone.

9. The method of claim 1, wherein the first metric, that is correlated with the one or more data center locations, comprises a power metric, and wherein the first zone comprises a rack housing the first subset of IHSs.

10. The method of claim 1, wherein the first metric, that is correlated with the one or more data center locations, comprises a network metric, and wherein the first zone comprises a rack housing the first subset of IHSs.

11. A system for utilizing telemetry data to identify zones within a data center, the system comprising:
a plurality of IHSs (Information Handling Systems) operating at various locations within the data center, wherein individual IHSs of the plurality of IHSs comprise a remote access controller providing remote management of the respective IHS, wherein the remote access controller of the individual IHSs of the plurality of IHSs reports metric data that identifies a location of a plurality of locations of the respective IHS within the data center; and
a non-transitory computer-readable storage medium storing a remote management application that, when executed by at least one processor, is configured to:
analyze the data center locations of the IHSs specified in the reported metric data to identify a first metric of the metric data that is correlated with one or more locations of the plurality of locations within the data center;
based at least in part on the first metric that is correlated with the one or more data center locations, identify a first zone of the data center that comprises a first subset of the plurality of IHSs, wherein a first subset of the metric data, collected from the first subset of the plurality of IHSs within the first zone of the data center, comprises anomalous metric data relative to a second subset of the metric data collected from neighboring IHSs; and
adjust operations of the data center within the first zone of the data center, identified based at least in part on the first metric of the metric data collected from the individual IHSs that is correlated with the one or more data center locations, in order to address the anomalous metric data within the first subset of metric data collected from the first subset of IHSs.

12. The system of claim 11, wherein the remote access controller of the individual IHSs of the plurality of IHSs collects the metric data from respective IHS components via sideband management connections with the respective IHS components.

13. The system of claim 11, wherein the correlation of the first metric with the one or more data center locations is identified based on a principal component analysis of the collected metric data.

14. The system of claim 11, wherein the first zone of the data center, that includes the first subset of IHSs within the data center reporting anomalous metric data relative to neighboring IHSs, comprises a rack housing the first subset of IHSs.

15. The system of claim 11, wherein the first zone of the data center, that includes the first subset of IHSs within the data center reporting anomalous metric data relative to neighboring IHSs, comprises one or more rows that span a plurality of adjacent racks of the data center.

16. A non-transitory computer-readable storage device having instructions stored thereon for utilizing telemetry data to identify zones within a data center comprised of a plurality of IHSs (Information Handling Systems), wherein upon execution by one or more processors, the instructions cause the one or more processors to:

analyze data center locations of the IHSs specified in metric data collected from the plurality of IHSs operating at a plurality of locations within the data center, wherein the metric data collected from individual ones of the respective IHSs identifies a respective location of the respective IHS within the data center, and wherein the collected metric data is analyzed to identify a first metric of the metric data that is correlated with one or more locations of the plurality of locations within the data center;

based at least in part on the first metric that is correlated with the one or more data center locations, identify a first zone of the data center that comprises a first subset of the plurality of IHSs, wherein a first subset of the metric data collected from the first subset of the plurality of IHSs within the first zone of the data center, comprises anomalous metric data relative to a second subset of the metric data collected from neighboring IHSs; and adjust operations of the data center within the first zone, identified based at least in part on the first metric of the metric data collected from the individual IHSs that is correlated with the one or more data center locations, in order to address the anomalous metric data within the first subset of metric data collected from the first subset of IHSs.

17. The computer-readable storage device of claim 16, wherein a remote access controller of the individual IHSs of the plurality of IHSs collects the metric data from respective IHS components via sideband management connections with the respective IHS components.

18. The computer-readable storage device of claim 16, wherein the correlation of the first metric with the one or more data center locations is identified based on a principal component analysis of the collected metric data.

19. The computer-readable storage device of claim 16, wherein the first zone of the data center, that includes the first subset of IHSs within the data center reporting anomalous metric data relative to neighboring IHSs, comprises a rack housing the first subset of IHSs.

20. The computer-readable storage device of claim 16, wherein the first zone of the data center, that includes the first subset of IHSs within the data center reporting anomalous metric data relative to neighboring IHSs, comprises one or more rows that span a plurality of adjacent racks of the data center.

* * * * *